(12) United States Patent
Jurisch

(10) Patent No.: US 7,489,122 B2
(45) Date of Patent: Feb. 10, 2009

(54) METHOD AND DEVICE FOR MEASURING VOLTAGE

(75) Inventor: Andreas Jurisch, Schwante (DE)

(73) Assignee: Siemens Aktiengesellschaft, Munich (DE)

( * ) Notice: Subject to any disclaimer, the term of this patent is extended or adjusted under 35 U.S.C. 154(b) by 229 days.

(21) Appl. No.: 10/573,541

(22) PCT Filed: Sep. 16, 2004

(86) PCT No.: PCT/DE2004/002122

§ 371 (c)(1),
(2), (4) Date: Mar. 27, 2006

(87) PCT Pub. No.: WO2005/031374

PCT Pub. Date: Apr. 7, 2005

(65) Prior Publication Data

US 2006/0232264 A1 Oct. 19, 2006

(30) Foreign Application Priority Data

Sep. 26, 2003 (DE) ................................ 103 46 356

(51) Int. Cl.
*G01R 31/02* (2006.01)
(52) U.S. Cl. ...................................... 324/142
(58) Field of Classification Search ................. None
See application file for complete search history.

(56) References Cited

U.S. PATENT DOCUMENTS 3,870,927 A 3/1975 Hughes
3,962,609 A 6/1976 Chaudhuri
5,068,598 A 11/1991 Moncorge
6,236,949 B1 5/2001 Hart
2002/0171433 A1 11/2002 Watanabe et al.

FOREIGN PATENT DOCUMENTS

| DE | 1 113 749 | 9/1961 |
|---|---|---|
| DE | 1 225 756 | 9/1966 |
| DE | 2 325 449 | 11/1974 |
| DE | 23 54 978 | 6/1976 |
| DE | 26 30 959 | 1/1978 |
| DE | 26 30 958 | 7/1978 |
| DE | 35 35 102 A1 | 4/1987 |
| DE | 35 40 988 A1 | 5/1987 |
| DE | 44 18 176 A1 | 2/1996 |
| GB | 1 575 148 | 9/1980 |

*Primary Examiner*—Jermele M Hollington
(74) *Attorney, Agent, or Firm*—Laurence A. Greenberg; Werner H. Stemer; Ralph E. Locher

(57) ABSTRACT

A method measures a voltage at a point of a current distribution network via a measuring circuit. The measuring circuit contains a voltage transmitter which is coupled to a current-conducting conductor of the network, and a further processing configuration which is connected to the voltage transmitter and which outputs a voltage measuring value as an output signal at the output thereof. The output signal of the measuring circuit is corrected by a correction element that has a transfer function that is inverse to the transfer function of the measuring circuit in order to obtain precise voltage measuring values that are independent from the type of the selected voltage transmitter. A measuring device is provided for carrying out the method.

25 Claims, 1 Drawing Sheet

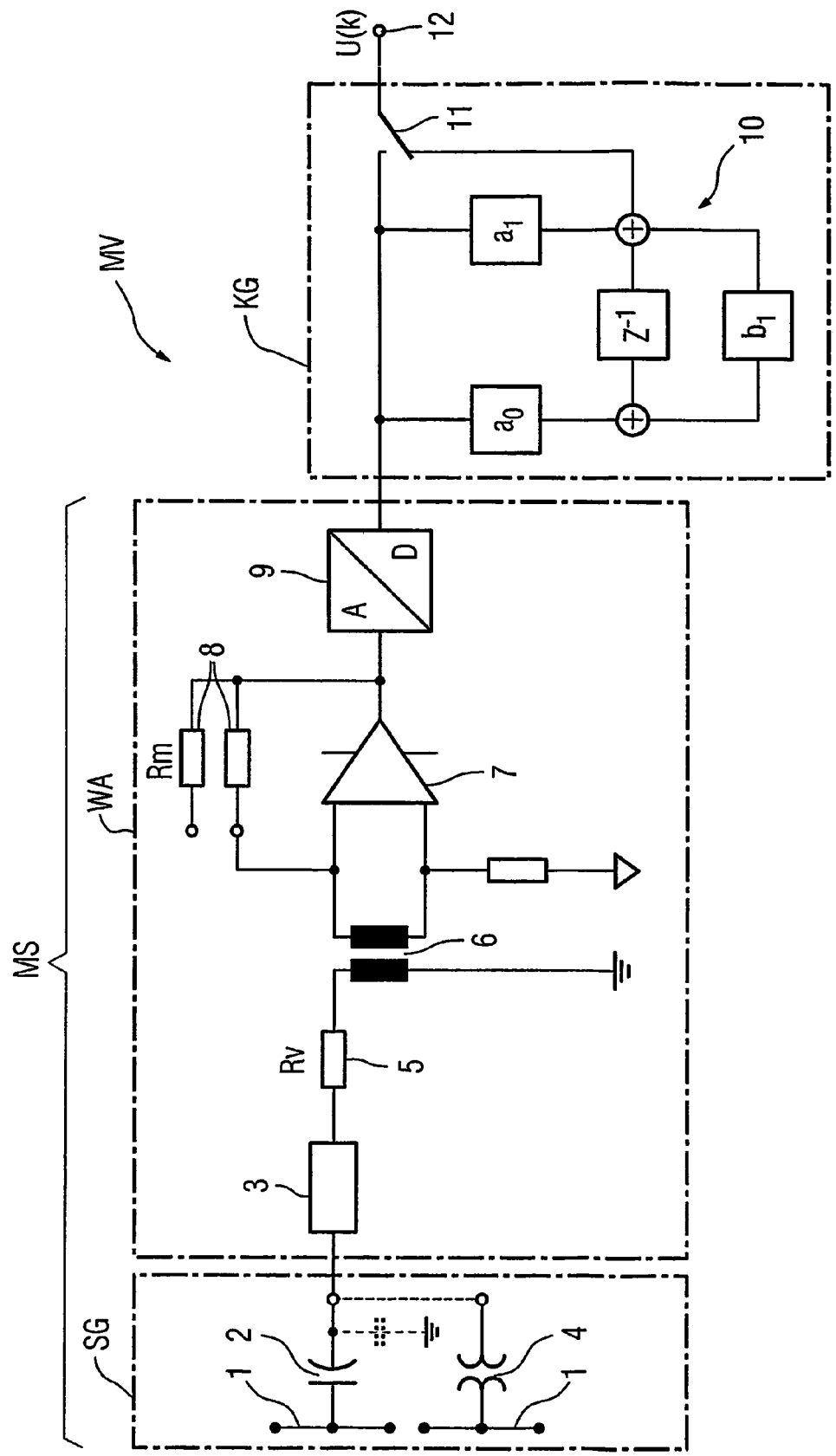

METHOD AND DEVICE FOR MEASURING VOLTAGE

This application is a 371 of PCT/DE04/02122 filed on Sep. 16, 2004.

BACKGROUND OF THE INVENTION

Field of the Invention

The invention relates to a method for measuring the voltage at a point in a power distribution network by means of a measuring circuit, which has a voltage sensor, which is coupled to a current-carrying conductor of the network, and a further-processing arrangement, which is connected to the voltage sensor, and outputs a measured voltage value as the output signal at its output, and to an apparatus for carrying out this method.

In power distribution networks, preferably in the voltage range of 6-20 kV, at present devices are still predominantly used for protection and control purposes which represent directionally independent overcurrent protection. This is sufficient in networks having a central supply and in which the current direction is predetermined. In the case of a decentralized supply, however, it is also necessary, for the response of protective devices, for the direction of a current to also be detected, in addition to the level of the current. This can be determined by additional voltage measurements in the network. For this purpose, inductive voltage transformers are generally used today as the voltage sensors. They make it possible to measure the voltage accurately, but represent a considerable cost factor, in particular if they are installed retrospectively in existing networks.

The German laid-open specification DE 23 25 449 A1 describes the use of a capacitive voltage transformer as a voltage sensor for the purpose of measuring the voltage in high-voltage switchgear assemblies, said voltage transformer being formed from a current-carrying conductor of the high-voltage network and an electrode embedded in a post insulator of the conductor. Such capacitive voltage transformers are generally used today, however, merely for establishing the presence of a voltage having a specific minimum level on a line of a power distribution network the displacement current of a high-voltage coupling capacitor, since the measurement result obtained is sometimes relatively inaccurate, with the result that it can only be used to establish the presence of the voltage but not to determine its precise value.

SUMMARY OF THE INVENTION

The object of the present invention is to specify a method and an apparatus of the abovementioned type, by means of which accurate voltage measurement can be carried out irrespective of the type of voltage sensor.

In terms of the method, this object is achieved according to the invention by the fact that, in a method of the mentioned type, the output signal from the measuring circuit is corrected so as to achieve a correct measured value by means of a correction element having a transfer function which is inverse to the transfer function of the measuring circuit. As a result of the fact that the output signal from the measuring circuit is corrected so as to achieve a correct measured value by means of a correction element having a transfer function which is inverse to the transfer function of the measuring circuit, it is possible, using comparatively simple means, for sufficiently accurate voltage measurement to be carried out irrespective of the type of voltage sensor.

The method according to the invention can advantageously provide for a capacitor device to be used as the voltage sensor of the measuring circuit. The use of a capacitor device—i.e. a capacitive voltage transformer—as the voltage sensor represents a comparatively cost-effective possibility for voltage measurement.

In this context, it is also regarded as advantageous if a coupling capacitor, formed from the current-carrying conductor of the network and an electrode which is DC-isolated from said current-carrying conductor, is used as the capacitor device. Such capacitor devices have a comparatively simple design; in addition, capacitor devices of this type are already often provided, for example, in high-voltage bushings of switchgear cells.

As an alternative, however, it is also advantageously possible to provide for an inductive voltage transformer, which is connected on the primary side to the current-carrying conductor, to be used as the voltage sensor. This is regarded as being particularly advantageous because such an inductive voltage transformer generally makes very accurate voltage measurement possible. Since, however, the measuring circuit can also have a transfer function which slightly falsifies the measured voltage value when an inductive voltage transformer is used, even more accurate measured voltage values can be achieved in this case too when using the correction by means of the correction element in accordance with the method according to the invention.

In this case, however, it is also regarded as advantageous if a correction element is used which can optionally be bypassed via a switch. In this manner, the correction element can easily be bypassed if the measured voltage values achieved using the inductive voltage transformer are sufficiently accurate; in such a case no correction of the measured voltage values therefore takes place.

Depending on whether the output signal from the measuring circuit is analog or digital, an analog or digital filter having a transfer function which is inverse to the transfer function of the measuring circuit can be used as the correction element. The analog filter expediently simulates a transfer function having a PID characteristic.

When using a digital filter, a temporally discrete transfer function is suitable as the inverse transfer function. This can be generated in a manner known per se by means of a bilinear transformation.

In this context, it is also regarded as advantageous if, in the case of the digital filter, the coefficients of the temporally discrete transfer function can be altered. In this case, the transfer function of the correction element can be matched in a particularly simple manner to transfer functions of the measuring circuit brought about by different voltage sensors.

One further advantageous development of the method according to the invention also provides for a further-processing arrangement to be used which has a DC isolating element in its input region. The further-processing arrangement and the correction element can thus be DC-isolated from the high-voltage side without any problems.

In terms of the apparatus, the object on which the invention is based is achieved by a measuring apparatus for measuring the voltage at a point in a power distribution network by means of a measuring circuit, which has a voltage sensor, which is coupled to a current-carrying conductor of the network, and a further-processing arrangement, which is connected to the voltage sensor, and outputs a measured voltage value as the output signal at its output, a correction element being connected to the measuring circuit on the output side in accordance with the invention so as to achieve a correct measured value from the output signal from the measuring circuit, said correction element having a transfer function which is inverse to the transfer function of the measuring circuit. Owing to the use of a correction element having a transfer function which is inverse to the transfer function of the measuring circuit, it is possible to achieve accurate measured voltage values with such a measuring apparatus using any desired measuring sensors.

For reasons of cost, provision can advantageously be made for the voltage sensor to be a capacitor device. In accordance with one preferred embodiment, such a capacitor device may also be a coupling capacitor formed from the current-carrying conductor of the network and an electrode which is DC-isolated from said current-carrying conductor. An electrode having this design may preferably be a so-called ring electrode.

As an alternative, however, provision may also be made for the voltage sensor to be an inductive voltage transformer, which is connected on the primary side to the current-carrying conductor.

Since such an inductive voltage transformer often already produces measured voltage values of a very high quality, in this context provision may also be made for it to be possible for the correction element to be optionally bypassed via a switch.

However, even in the case of an inductive voltage transformer, the quality of the measured voltage values can often be increased further still by the use, according to the invention, of a correction element having an inverse transfer function, with the result that it is also worthwhile in this case to use the correction element, which in this case is therefore not bypassed.

In other words, a measuring apparatus according to the invention has, for example, an input terminal for the optional connection to any desired voltage sensors, for example to the electrode of the coupling capacitor or to the secondary winding of an inductive voltage transformer, which is connected on the primary side to the current-carrying conductor. As a result, it is in this case possible to connect the measuring apparatus to the corresponding voltage sensor irrespective of whether a coupling capacitor or an inductive voltage transformer has already been installed at the measurement point in the network. The measuring apparatus is then provided with a switch for optionally switching the correction element which simulates the inverse transfer function on or off in order to switch the correction element on in the event of a connection to the coupling capacitor and to switch the correction element off, if required, in the event of a connection to the voltage transformer. Even in the case of the inductive voltage transformer, in this case the correction element could remain switched on, in which case the inverse transfer function of said correction element would have to be correspondingly altered. It would be possible for this to be carried out in a simple manner, in particular in the case of a digital filter having a temporally discrete transfer function as the correction element, by adjusting the coefficients.

Depending on whether the output signal from the measuring circuit is an analog or a digital output signal, an analog filter having a PID characteristic or a digital filter can correspondingly be used.

One advantageous development of the measuring apparatus according to the invention provides for the further-processing arrangement to have a DC isolating element in its input region. It is thus possible to DC-isolate the high-voltage part of the measuring apparatus from the low-voltage part in a simple manner. The DC isolating element can preferably be an inductive current transformer.

In accordance with one further advantageous development of the measuring apparatus according to the invention, the voltage sensor is connected on the output side to a series circuit comprising a resistor having a high resistance value and the primary winding of the inductive current transformer. The input voltage of the further-processing arrangement is converted to a comparatively low current via the resistor having a high resistance value such that the inductive current transformer can be designed to be comparatively small and thus inexpensive.

One further advantageous development of the measuring apparatus according to the invention also provides for the secondary winding of the current transformer to be loaded by a negative feedback operational amplifier with an internal resistance of 0 ohm. In turn, a current/voltage conversion takes place using the operational amplifier, in which case the range of the level of the resulting voltage can be adjusted by the negative feedback of the operational amplifier, for example via a resistor arranged in the negative feedback path.

In addition, one advantageous embodiment of the measuring apparatus according to the invention is regarded as the fact that the measuring circuit has an analog-to-digital converter on the output side in order to generate digital output signals from the measurement arrangement.

BRIEF DESCRIPTION OF THE DRAWING

The single FIGURE of the drawing is a schematic diagram of a measuring apparatus according to the invention.

DESCRIPTION OF THE PREFERRED EMBODIMENT

The invention will be explained in more detail below with reference to an exemplary embodiment illustrated in the FIGURE. The FIGURE shows the circuit diagram of a measuring apparatus MV for voltage measurement using a digital filter as the correction element KG in order to correct the measured voltage values.

A current conductor 1 of a power distribution network forms an electrode of a capacitive voltage transformer as the voltage sensor SG in the form of a high-voltage coupling capacitor 2. The other electrode of the coupling capacitor 2, which is preferably passed around the current conductor 1 in annular fashion such that it is DC-isolated from said current conductor 1, is connected to an input terminal 3 of a further-processing arrangement WA of the measuring apparatus MV. In a similar manner, other forms of capacitive voltage transformer are also possible as the voltage sensor SG, however. As illustrated in the FIGURE, the capacitive voltage transformer may optionally be a capacitive divider, whose low-voltage capacitor is represented by dashed lines in the FIGURE. An embodiment in the form of a capacitive divider is not absolutely necessary, however. Instead, as is indicated by the further dashed line, the secondary winding of an inductive voltage transformer 4, which is connected on the primary side to the current conductor 1, can also be connected to the input terminal 3 of the further-processing arrangement WA. As is indicated in the FIGURE by the curved bracket, the voltage sensor SG and the further-processing arrangement WA together form a so-called measuring circuit MS.

The text which follows will consider the case in which the coupling capacitor 2 as the voltage sensor SG is connected to the input terminal 3 of the further-processing arrangement WA. A series resistor 5 (Rv), which generally has a high resistance value and is arranged downstream of the input terminal 3, carries out a voltage/current conversion of the voltage, which has been tapped off capacitively at the electrode, which is DC-isolated from the current conductor 1, of the coupling capacitor 2, to a displacement current. In addition, the series resistor 5 forms, with the capacitance of the coupling capacitor 2, a high-pass filter and therefore improves the input-side EMC (electromagnetic compatibility) performance of the measuring apparatus MV.

A DC isolating element, which is connected on the primary side in series with the series resistor 5 and is in the form of an inductive current transformer 6, on the one hand serves the purpose of potential isolation and, on the other hand, serves the purpose of reducing the coupling capacitance with respect to the high-voltage conductor and thus brings about further EMC shielding. Owing to the displacement current which is low as a result of the dimensions of the series resistor 5, the inductive current transformer 6 can be designed to be relatively small.

An operational amplifier 7 having a feedback resistor 8 (Rm) is connected to the secondary side of the inductive current transformer 6. The operational amplifier 7 acts as an active load for the inductive current transformer 6 with an internal resistance of 0 ohm. At the same time, the operational amplifier 7 takes on the function of current/voltage conversion and converts the current produced by the inductive current transformer 6 to a voltage. The ratio between the output voltage and the input current of the operational amplifier 7 is determined by the value Rm for the feedback resistor 8. This value can be switched over by means of a link or an analog switch, as indicated in the FIGURE, in order to be able to match the driving of the current transformer 6, which driving is dependent on the coupling capacitor 2 or the voltage transformer 3, to the measurement range of an analog-to-digital converter 9 downstream of the operational amplifier 7.

Said analog-to-digital converter 9 converts its input voltage to a digital sample sequence.

If the input terminal 3 of the further-processing arrangement WA is connected to the inductive voltage transformer 4, the transfer performance of the measuring circuit MS formed from the voltage sensor SG (i.e. in this case the inductive voltage transformer 4) and the further-processing arrangement WA is independent of the frequency in the relevant frequency range (50 or 60 Hz).

In contrast, in the event of a connection to the coupling capacitor 2, the following transfer function for the measuring circuit MS to the analog-to-digital converter 9 results:

$$\frac{U_A}{U_{Prim}} = \frac{j\omega C_D \cdot R_m}{1 + j\omega C_D \cdot R_v}$$

where $U_A$ is the voltage at the output of the operational amplifier 7, $U_{Prim}$ is the voltage of the current conductor 1, and $C_D$ is the capacitance of the coupling capacitor 2. If the value for $U_A$ resulting using this transfer function is left unchanged, a measured voltage value is obtained which is completely unsuitable for accurate voltage measurement. The transfer function of the entire measuring apparatus MV (comprising the voltage sensor SG, the further-processing arrangement WA and the correction element KG) therefore needs to be corrected by a downstream correction element KG by means of a transfer function which is inverse to the transfer function of the measuring circuit MS. This correcting inverse transfer function of the correction element KG should be formed in accordance with the following equation:

$$G_{corr} = \frac{1 + j\omega C_D \cdot R_v}{1 + j\omega T_K}$$

The resultant transfer function of the entire measuring apparatus MV in turn represents a high-pass filter, but with a new cut-off frequency $1/(2*pi*T_K)$. The time constant $T_K$ can in this case be selected such that the cut-off frequency is below the frequency range to be detected for the measured voltage value, with the result that the transfer function of the entire measuring apparatus MV is linear in this frequency range. It is particularly advantageous if $T_K$ is equal to the time constant of the current transformer used for detecting the current signals, which are likewise measured at the same time as the voltage signal.

If, as shown in the FIGURE, a digital filter 10 is used to correct the transfer function of the measuring circuit MS, the correcting transfer function $G_{corr}$ can previously be transformed into a temporally discrete transfer function $G(z^{-1})$. This takes place with the aid of the bilinear transformation $$e^{-j\omega T_A} = \frac{2}{T_A} \cdot \frac{z+1}{z-1}.$$

The right-hand side of this equation is the series expansion, terminated after the first element, of the function $e^{-j\omega \cdot T}$. This gives:

$$G(z^{-1}) = \frac{a_1 z^{-1} + a_0}{1 + b_1 z^{-1}},$$

where $z^{-1}$ is the delay of a sampled value by a sampling interval; $a_0$, $a_1$ and $b_1$ are coefficients of the temporally discrete transfer function. This temporally discrete transfer function $G(z^{-1})$ is implemented by the digital filter 10 illustrated in the FIGURE. This in turn has a final amplification at the frequency 0, with the result that the numerical stability of the apparatus is ensured even in the case of an offset of the analog-to-digital converter 9.

A switch 11 is used to connect the output of the analog-to-digital converter 9 to the measured value output 12 of the measuring apparatus MV either directly or via the digital filter 10. The direct connection can be selected if the inductive voltage transformer 4 as the voltage sensor SG is connected to the input terminal 3 of the further-processing arrangement WA, and the connection via the digital filter 10 is selected if the coupling capacitor 2 as the voltage sensor SG is connected to the input terminal 3. The switch 11 could, however, also be dispensed with, with the result that, in both cases, the digital filter 10 is included since an improvement in the quality of the measured voltage values can be achieved owing to the shift in the cut-off frequency of the transfer function of the entire measuring apparatus MV even in the case in which the inductive voltage transformer 4 is used. However, the coefficients of the digital filter 10 can in each case be adjusted differently for the connection to the inductive voltage transformer 4, on the one hand, and to the coupling capacitor 2, on the other hand.

Correspondingly, a measuring apparatus can also be implemented using analog voltage signals, in which case an analog filter would be used in place of the digital filter, and the analog-to-digital converter would be dispensed with.

I claim:

1. A method for measuring a voltage at a point in a power distribution network, which comprises the steps of:
    providing a measuring circuit having a voltage sensor coupled to a current-carrying conductor of the power distribution network and a further-processing configuration connected to the voltage sensor, the further-processing configuration having an output outputting a measured voltage value as an output signal;
    correcting the output signal from the measuring circuit into correct measured value in a correction element having a transfer function being inverse to a transfer function of the measuring circuit, the correction element being an electronic filter; and
    adjusting the transfer function of the electronic filter to match the transfer function of the measuring circuit.

2. The method according to claim 1, which further comprises providing a capacitor device as the voltage sensor of the measuring circuit.

3. The method according to claim 2, which further comprises forming the capacitor device as a coupling capacitor, formed from the current-carrying conductor of the power distribution network, and an electrode that is DC-isolated from the current-carrying conductor.

4. The method according to claim 1, which further comprises using an inductive voltage transformer having a primary side connected to the current-carrying conductor, as the voltage sensor.

5. The method according to claim 4, which further comprises providing the correction element with a switch for optionally bypassing a remainder of the correction element.

6. The method according to claim 1, wherein in a case where the output signal is an analog output signal, carrying out the correcting step with an analog filter having a PID characteristic as the correction element.

7. The method according to claim 1, wherein in a case where the output signal is a digital output signal, carrying out the correcting step with a digital filter as the correction element.

8. The method according to claim 7, which further comprises forming the digital filter with an inverse transfer function being represented by a temporally discrete transfer function.

9. The method according to claim 8, which further comprises forming the digital filter such that coefficients of the temporally discrete transfer function can be altered.

10. The method according to claim 1, which further comprises providing the further-processing configuration with a DC isolating element in an input region.

11. A measuring apparatus for measuring a voltage at a point in a power distribution network, the measuring apparatus comprising:
    a measuring circuit having a voltage sensor coupled to a current-carrying conductor of the power distribution network, and a further-processing configuration connected to said voltage sensor, said further-processing configuration having an output outputting a measured voltage value as an output signal; and
    an electronic filter functioning as a correction element and having an output side connected to said measuring circuit, said correction element receiving the output signal from said measuring circuit and outputting a corrected measured value, said correction element having a transfer function being inverse to a transfer function of said measuring circuit, said electronic filter functioning to adjust the transfer function of said correction element to match it to the transfer function of said measuring circuit.

12. The measuring apparatus according to claim 11, wherein said voltage sensor is a capacitor device.

13. The measuring apparatus according to claim 12, wherein said capacitor device is a coupling capacitor formed from the current-carrying conductor of the power distribution network and an electrode which is DC-isolated from said current-carrying conductor.

14. The measuring apparatus according to claim 13, wherein said electrode of said coupling capacitor is a ring electrode surrounding the current-carrying conductor.

15. The measuring apparatus according to claim 11, wherein said voltage sensor is an inductive voltage transformer having a primary side connected to the current-carrying conductor.

16. The measuring apparatus according to claim 15, wherein said correction element has a switch for optionally bypassing a remainder of said correction element.

17. The measuring apparatus according to claim 11, wherein said measuring circuit outputting an analog output signal as the output signal and said correction element is an analog filter having a PID characteristic.

18. The measuring apparatus according to claim 11, wherein said measuring circuit outputting a digital output signal as the output signal and said correction element is a digital filter.

19. The measuring apparatus according to claim 18, wherein the transfer function of said digital filter is a temporally discrete transfer function.

20. The measuring apparatus according to claim 19, wherein the temporally discrete transfer function of said digital filter has variable coefficients.

21. The measuring apparatus according to claim 11, wherein said further-processing configuration has an input region and a DC isolating element in said input region.

22. The measuring apparatus according to claim 21, wherein said DC isolating element is an inductive current transformer.

23. The measuring apparatus according to claim 22, wherein:
    said further-processing configuration has a resistor with a high resistance value;
    said inductive current transformer has a primary winding connected in series with said resistor defining a series circuit; and
    said voltage sensor has an output side connected to said series circuit.

24. The measuring apparatus according to claim 23, wherein:
    said further-processing configuration has a negative feedback operational amplifier with an internal resistance of zero ohms; and
    said inductive current transformer has a secondary winding loaded by and connected to said negative feedback operational amplifier.

25. The measuring apparatus according to claim 11, wherein said further-processing configuration has an analog-to-digital converter on said output side.

* * * * *